United States Patent [19]
Ward et al.

[11] Patent Number: 5,097,442
[45] Date of Patent: Mar. 17, 1992

[54] PROGRAMMABLE DEPTH FIRST-IN, FIRST-OUT MEMORY

[75] Inventors: M. Dwayne Ward, Garland; Kenneth L. Williams, Dallas, both of Tex.

[73] Assignee: Texas Instruments Incorporated, Dallas, Tex.

[21] Appl. No.: 146,526

[22] Filed: Jan. 21, 1988

Related U.S. Application Data

[63] Continuation-in-part of Ser. No. 746,920, Jun. 20, 1985, and a continuation-in-part of Ser. No. 892,228, Aug. 1, 1986, Pat. No. 4,829,475, and a continuation-in-part of Ser. No. 45,010, Apr. 30, 1987, Pat. No. 4,864,543.

[51] Int. Cl.[5] .......................... G11C 7/00; G11C 19/00
[52] U.S. Cl. ..................................... 365/78
[58] Field of Search ................... 265/73, 78, 189, 221, 265/189.12, 189.07; 377/64, 66

[56] References Cited

U.S. PATENT DOCUMENTS

| | | | |
|---|---|---|---|
| 3,141,153 | 7/1964 | Klein | 365/73 |
| 3,691,536 | 9/1972 | Peterson | 365/73 |
| 3,972,031 | 7/1976 | Riemenschneider | 365/73 X |
| 4,222,102 | 9/1980 | Jansen et al. | 365/73 X |
| 4,297,567 | 10/1981 | Herzner | 365/73 X |
| 4,592,019 | 5/1986 | Huang et al. | 365/78 |
| 4,599,708 | 7/1986 | Schuster | 365/174 X |
| 4,680,733 | 7/1987 | Duforestel et al. | 377/64 X |
| 4,694,426 | 9/1987 | Mason | 365/78 |
| 4,751,675 | 6/1988 | Knauer | 365/189 X |
| 4,833,655 | 5/1989 | Wolf et al. | 365/73 X |

OTHER PUBLICATIONS

FIFO RAM Controller Tackles Deep Data Buffering, by Tom Pai Computer Design Aug. 1, 1986 pp. 109–112.

*Primary Examiner*—Alyssa H. Bowler
*Attorney, Agent, or Firm*—B. Peter Barndt; Richard Dolandson; William E. Hiller

[57] ABSTRACT

A first-in, first-out memory (10) can store a programmable number of data words at respective address locations within a memory (76). A read address generator (50, 58) generates a read pointer for pointing to a read address location in the memory (76). A depth address generator (42) points to a depth address location in the memory that is displaced from the read address location by a predetermined number of address locations. This depth address generator (42) is incremented to a next read depth address responsive to a read pulse (20) issued from a read/write controller (12). A write address generator (80) points to a write address location within memory (76). A comparator (52) compares the value stored in the write address generator (42) to the read depth address location stored in depth address generator (42) and is operable to generate a FULL memory status flag (24) responsive to their equality. Preferably, the comparator (52) also compares the read address to the write address, and is operable to generate an EMPTY status flag (26) responsive to their equality.

24 Claims, 4 Drawing Sheets

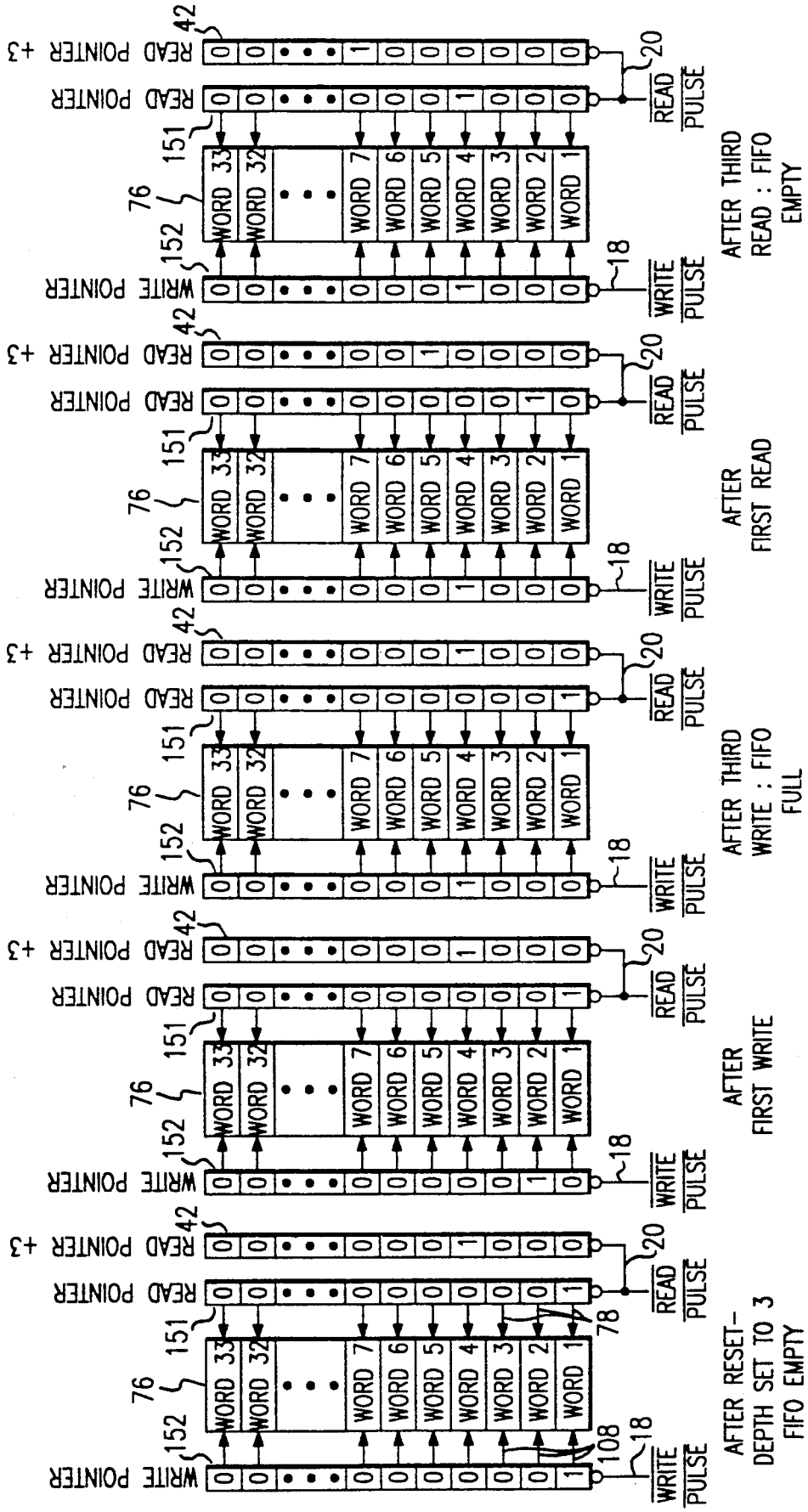

and 1b; and

PROGRAMMABLE DEPTH FIRST-IN, FIRST-OUT MEMORY

RELATED APPLICATIONS

This application is a continuation-in-part of copending application Ser. No. 06/746,920 filed June 20, 1985 and entitled "Zero Fall-Through Time Asynchronous FIFO Buffer with Nonambiguous Empty/Full Resolution," and is further a continuation-in-part of copending application Ser. No. 06/892,228 filed Aug. 1, 1986 and entitled "Method and Apparatus for Simultaneous Address Increment and Memory Write Operations," now U.S. Pat. No. 4,829,475 and is further a continuation-in-part of application Ser. No. 07/045,010 filed Apr. 30, 1987 and entitled "First-In, First-Out Memory With Multiple-Tier Ring Counter Address Pointers now U.S. Pat. No. 4,864,543.

TECHNICAL FIELD OF THE INVENTION

This invention relates to first-in, first-out (FIFO) memories, and more particularly concerns programmable-depth FIFO memories and a method for programming such memories.

BACKGROUND OF THE INVENTION

First-in, First-out (FIFO) memories are commonly used to transfer data between different digital systems with independent clocking sources. FIFOs generally fall into one of two main categories: those in which data loaded into the inputs has to ripple through the entire memory before appearing at the outputs, and those in which data has only to propagate through the memory currently being read before appearing at the outputs. The latter are commonly called "zero fall-through time" FIFOs.

Virtually all conventional FIFOs contain some logic to determine if the FIFO is full. This condition may be indicated by calculating the number of words written into the memory that is in excess of the number of words read out from the memory. Logic is also usually provided to determine whether the memory is empty, corresponding to the condition wherein the number of words that have been read out equals the number of words that have been written into the memory. Many of the these FIFOs also contain logic to indicate other degrees of use of the FIFO capacity, such as half-full, almost-full, and almost-empty conditions. The data word capacity of these FIFOs is conventionally fixed, as is the number of words indicated by the full, empty, etc. status flags.

Recently, however, a need has arisen for a FIFO whose word capacity can be used or defined as any number of words from one up to some maximum number. For instance, it may be desirable to define a memory capacity of 17 words or some other number specified by a particular application. It has further become desirable that such a FIFO continue to have status flags that indicate whether the memory is empty, full, or filled to some intermediate capacity.

SUMMARY OF THE INVENTION

The present invention discloses a first-in, first-out (FIFO) memory whose depth may be programmed and reprogrammed. According to one aspect of the present invention, the FIFO memory stores a programmable number of data words at respective address locations therein. A read pointer is provided for pointing to a read address location in the memory from which a data word is to be read. The read pointer is incremented to a next read address location in response to receiving a read command. A depth pointer points to a depth address location in the memory that is displaced from the read address location by a programmed number of address locations. The depth pointer is incremented to a next depth address location in response to the read command. A write pointer is provided for pointing to a write location that is related to the location to which a data work is to be written. The pointer is incremented to a next write address location responsive to a write command. A programmer of the FIFO is operable to selectively program and reprogram the programmed depth number, thereby changing the depth of the FIFO memory. The FIFO preferably includes a comparator for comparing the values of the write address location and the depth address location. The comparator is operable to disable the writing of data to the memory in response to the equality of the two compared address locations.

A second comparator may be provided for comparing the read address to the write address. This second comparator is operable to generate an EMPTY signal in response to the read address and the write address being equal. Status flags for intermediate conditions, such as ALMOST-FULL, HALF-FULL and ALMOST-EMPTY, can be generated by provision of further comparator units, programmers and pointers.

A principal advantage of the invention is its provision of programmable and reprogrammable depth. The operator can program any memory depth up to the maximum allowed by the memory architecture, which in turn is fixed as some number less than the number of address locations in the memory. Another advantage of the invention is the provision of status flags which are able to signal that a preselected portion of the programmed depth is being used, regardless of the depth to which the memory has been programmed. This is in contrast to conventional FIFO memories, which have fixed-depth memories and status flags that are only able to be generated responsive to fractions of those fixed memory depths.

BRIEF DESCRIPTION OF THE DRAWINGS

Other aspects of the invention and their advantages are set forth in the following detailed description of a preferred embodiment of the invention. This preferred embodiment is illustrated by the appended drawings, in which:

FIGS. 3a–3e are sequential simplified block diagrams illustrating the operation of the FIFO memory of FIGS. 1a and 1b.

DETAILED DESCRIPTION

Figure 1A:
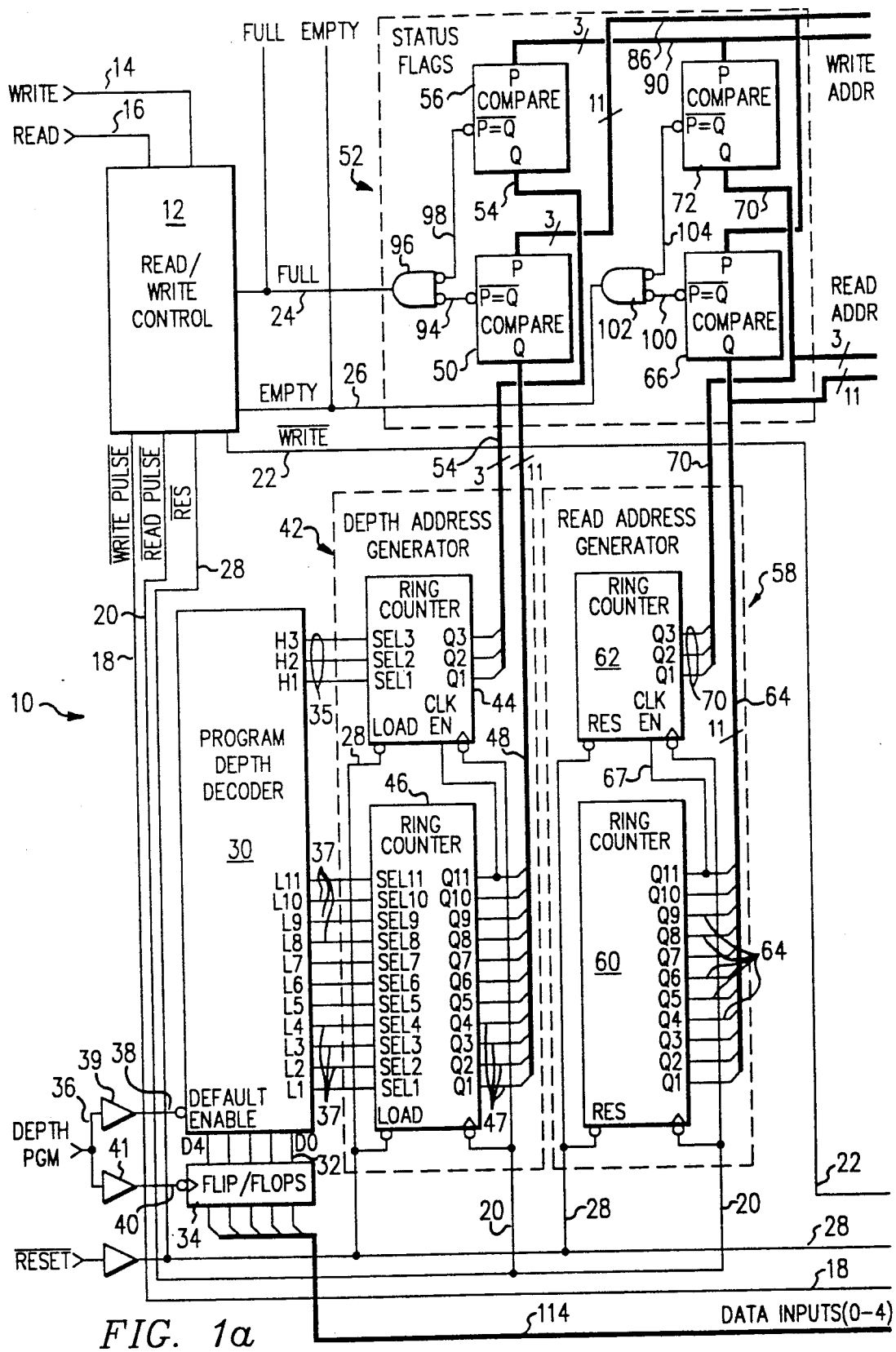
FIGS. 1a and 1b together constitute a schematic electrical block diagram of a FIFO memory incorporating depth-programming and flag generation circuitry according to the invention.

FIG. 1 illustrates a schematic electrical block diagram of a 32-word FIFO indicated generally at 10 that incorporates the depth programming and flag generating features of the invention. Turning first to FIG. 1a, a read/write control module 12 of FIFO 10 receives external write signals on a write signal line 14. Write signal line 14 is connected to a device (not shown) connected to FIFO 10 for writing data into sequential address locations in the memory array (later described). External read signals are received on a read command line 16 from a device (not shown) connected to the FIFO for reading data from selected sequential address locations in the memory array. When enabled, read/write control module 12 will generate a write pulse or signal on an output line 18 in response to an external write signal on line 14, and will generate a read pulse or signal on an output line 20 in response to an external read signal on line 16. Read/write control module 12 in addition issues an inverted write signal on a line 22 apart from the write pulse on line 18. Read/write controller 12 also has as inputs a FULL status flag line 24, an EMPTY status flag line 26 and a $\overline{\text{RESET}}$ line 28.

A program depth decoder 30 is provided to program the apparent depth of the memory array. Decoder 30 receives five data inputs D0–D4 on data input lines 32 from a set of flip-flop registers 34. The signals on input lines 32 represent a value N. Decoder 30 is operable to decode a depth number onto its high-order output lines 35 and its low-order output lines 37. A "depth program" input line 36 is connected to an inverter 39, an output of which is connected to a default enable input 38 of decoder 30. Depth program line 36 is further connected through a buffer 41 to a clock input 40 of flip-flop register 34.

A programmable depth address pointer or generator is indicated generally by the dashed enclosure at 42. Depth address generator 42 has a high-order ring counter 44 that accepts the high-order outputs 35 from decoder 30 on its SEL1–SEL3 inputs. A low-order ring counter 46 has inputs SEL1–SEL11 connected to the low-order outputs 37 of decoder 30. Reset line 28 is connected to LOAD inputs of ring counters 44 and 46.

Ring counters 44 and 46 receive read pulses on read pulse line 20 at clock inputs thereof. Low-order ring counter 46 is connected to low-order bit output lines 48 that are connected to a low-order bit comparator 50. Comparator 50 is a portion of a status flag generator block indicated generally at 52 by a dashed box. Low-order bit output Q11 of ring counter 46 is further connected to an enable input of high-order ring counter 44 through a clock enable line 53.

A high-order bit will appear at one of ring counter 44's output lines 54, which are connected to a high-order bit comparator 56 inside status flag generator 52.

A read address generator is indicated generally at 58 by a dashed box, and incorporates a low-order ring counter 60 and a high-order ring counter 62. Low-order ring counter 60 has eleven output bit lines 64. A "1" bit will appear on one of these bit lines 64, and "0" bits will appear on the remainder thereof. Read pulse line 20 is connected to clock inputs of ring counters 60 and 62. Ring counters 60 and 62 have reset inputs that are connected to reset line 28. Low-order bit lines 64 of ring counter 60 are connected to a Q input of a comparator 66 inside status flag generator 52. Low-order bit output line Q11 of ring counter 60 is in addition connected to a clock enable input of ring counter 62 through a line 67. Reset inputs of counters 60 and 62 are connected to reset line 28.

A "1" bit will appear on one of the high-order output bit lines 70, and a "0" bit will appear on each of the remainder of lines 70. High-order output bit lines 70 are connected to a Q input of a high-order bit comparator 72 located within status flag generator 52.

Figure 1B:
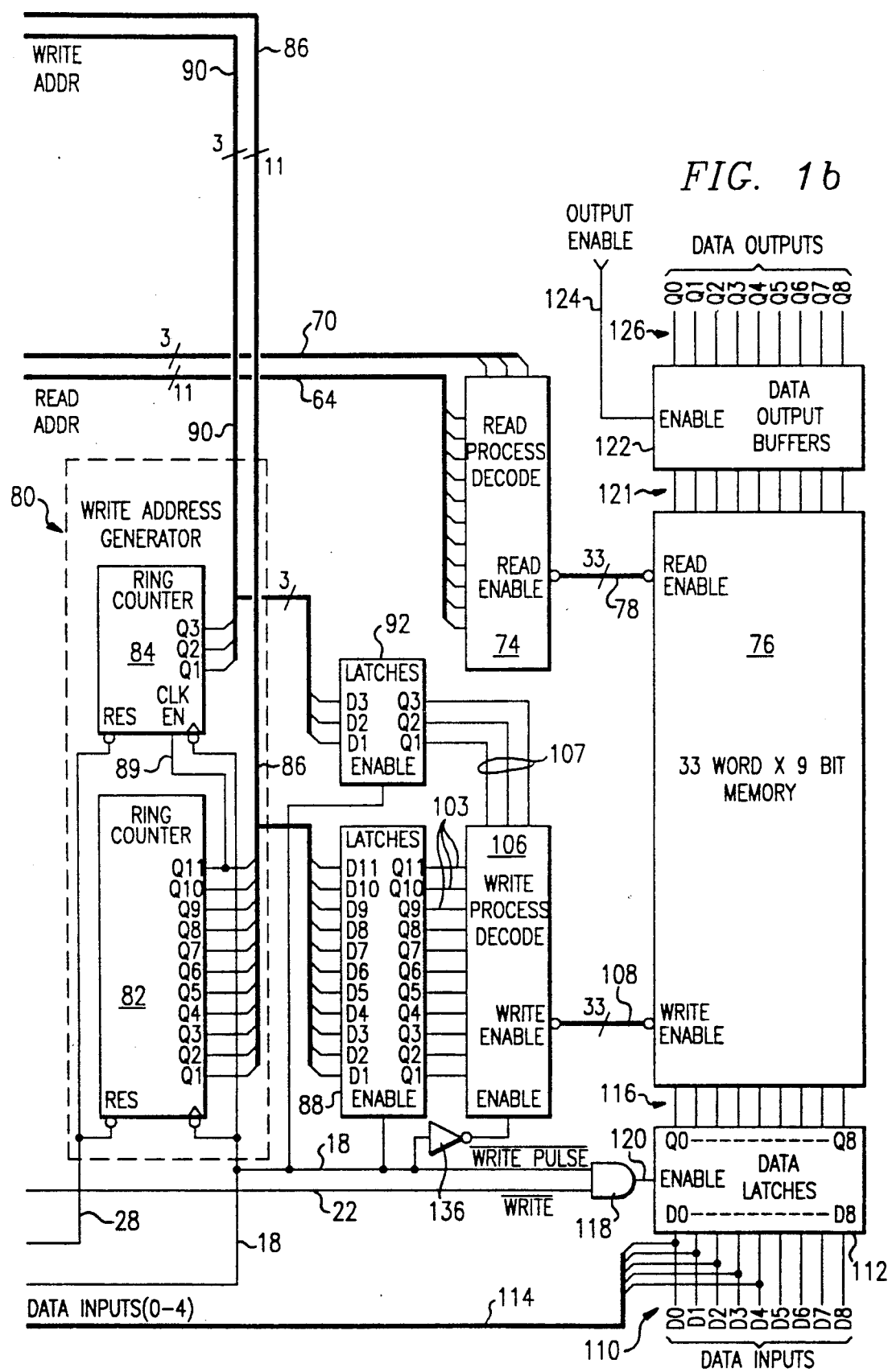

Turning to FIG. 1b, low-order bit lines 64 are further connected to inputs of a read process decoder 74. High-order bit lines 70 are input into a plurality of high-order inputs of read process decoder 74. Read process decoder 74 outputs a 33-line read enable bus 78 that enables one of the 33 words of the FIFO memory array 76 for a data read operation.

A write address pointer or generator is indicated generally at 80. Write address generator 80 includes a low-order ring counter 82 and a high-order ring counter 84. Ring counter 82 is identical to ring counter 60, and ring counter 84 is identical to ring counter 62. Low-order ring counter 82 is clocked by the input of write commands or pulses on write pulse line 18, and is reset to an initial value through the input of a descending transition on reset line 28. Ring counter 82 has output lines 86 that are connected to D1–D11 inputs of a write enable latch array 88, and further to a P input of comparator 50 (FIG. 1a). The Q11 bit of low-order ring counter 82 is connected to a clock enable input of high-order ring counter 84 through a line 89.

High-order ring counter 84 has output lines 90 that are connected to a high-order write enable latch array 92 at inputs D1–D3 thereof, and further to the P input of high-order comparator 56 inside status flag generator 52 (FIG. 1a).

Returning to FIG. 1a, comparator 50 compares the location of a low-order depth address bit inside ring counter 46 to the location of a low-order write address bit inside ring counter 82. Output line 94 of comparator 50 is connected to an inverting input of an AND gate 96. Comparator 56 compares the location of high-order bit in depth address ring counter 44 to the location of the high-order bit in write ring counter 84 (FIG. 1b). Comparator 56 has an output 98 that is connected to a second inverting input of AND gate 96. The output of AND gate 96 is connected to FULL flag signal line 24.

Comparator 66 (FIG. 1a) compares the location of the low-order bit in from a read ring counter 60 to the low-order bit from write ring counter 82. Comparator 66 has an output 100 that is connected to an inverting input into an AND gate 102. Comparator 72 compares the high-order bit from read address generator 58 to the high-order bit from write address generator 80. Comparator 72 has an output 104 that is inverted and is connected to the second input of AND gate 102. The output of AND gate 102 is connected to the EMPTY status flag signal line 26.

In FIG. 1b, low-order write latch array 88 has a plurality of output lines 103 that are connected to respective inputs of a write process decoder 106. Write pulse line 18 is connected to an enable input of latch array 88. High-order bit latch array 92 has a plurality of high-order output bit lines 107 that are connected to high-order inputs of write process decoder 106. An enable input of latch array 92 is connected to write pulse line 18.

Decoder 106 is operable to decode high- and low-order input bits into a write enable signal that is output on one of 33 output lines 108. Output lines are connected to respective word address locations (not shown) inside memory array 76 for enabling the writing of data thereto.

A plurality of data inputs D0–D8 indicated generally at 110 are connected to respective inputs D0–D8 of a data latch array 112. In addition, data bits D0–D4 of lines 110 are connected through lines 114 to the inputs of flip-flop registers 34. Data latch block 112 has output lines 116 that are connected to memory array 76. An AND gate 118 receives as its inputs $\overline{\text{WRITE}}$ line 22 and write pulse line 18. Its output 120 is connected to an enable input of data latch block 112. A plurality of output lines indicated generally at 121 of memory array 76 are connected to a respective plurality of data output buffers 122. Output buffer block 122 also receives an output enable line 124, which enables the output of data on external data outputs indicated generally at 126.

Referring back to FIG. 1a, read/write controller 12 operates to generate low-going write pulses on line 18 in response to external write signals applied on line 14, and operates to generate low-going read pulses on line 20 in response to external read signals applied on line 16. A high signal on FULL line 24 inhibits controller 12 from generating write pulses, and a high signal on EMPTY line 26 will inhibit controller 12 from generating read pulses on line 20. Read/write controller 12 also generates an inverted write signal on line 22 that is applied to AND gate 118 (FIG. 1b). An inverted write signal on line 22 will appear very quickly after the appearance of a write signal on external input line 14. This will cause AND gate 118 to generate a low-going transition on its output 120, in turn enabling data latch array 116 to quickly latch the data appearing on data inputs 110.

When it is desired to program a certain depth number into FIFO 10, a 5-bit number is input on data lines D0–D4, and will therefore appear at the inputs of flip-flop registers 34. A low-going transition on depth program input line 36 clocks the flip-flop registers 34 to accept the five bits, which together store a depth value N. In the illustrated embodiment, the depth value N is not the same as the depth number desired to be programmed. Rather, N is subtracted from 32 to yield the desired depth by decoder 30. The number desired to be programmed (32−N) will then appear as encoded into a high-order "1" bit on one of high-order bit lines 35, and a low-order "1" bit on one of low-order bit lines 37.

Program depth decoder 30 employes conventional circuitry to perform this decoding step. For example, decoder 30 can comprise a logic array consisting of two arrays of NAND gates (not shown). The first array receives as its inputs various combinations of input lines 32 and their complements. The first array of NAND gates outputs intermediate signals to the inputs of a second array of NAND gates (not shown). The second array in turn outputs a high-order "1" bit on one of high-order bit lines 35, and a low-order "1" bit on one of the low-order bit lines 37.

The high-order "1" bit on line 35 is loaded into ring counter 44 in response to a low-going transition on reset line 28. Similarly, the low-order "1" bit from decoder 30 is loaded into ring counter 46 in response to the appearance of a low-going transition on reset line 28.

A high state of the depth program signal on line 36 is inverted by inverter 39 and applied as a low state on line 38 to the default enable input of decoder 30. This low state causes decoder 30 to equate N to 0, and therefore 32−N to 32, which is the same as the maximum capacity of the FIFO memory array 76. The number "32" will then be encoded into a high-order "1" bit on one of the bit lines 35, and a low-order "1" bit on one of the lines 37. Upon the occurrence of the next reset on line 28, a depth of 32 will be loaded into ring counters 44 and 46.

Each of ring counters 60, 62, 82 and 84 comprises a plurality of D-Q flip-flops (not shown) that are each operable to store a "1" bit or a "0" bit. The internal organization of ring counters 60, 62, 82 and 84 is conventional. Each of the flip-flops is connected to read pulse line 20 in the case of counters 62 and 60, and is connected to write pulse line 18 in the case of ring counters 82 and 84. In each ring counter block 62, 60, 82 and 84, all of the flip-flops except one have a reset input thereof connected to reset line 28, so that they will store a "0" bit upon being reset. One flip-flop in each of ring counters 62, 60, 82 and 84 will have a preset input thereof connected to reset line 28, such that these flip-flops will store "1" bits after a reset. In this way, ring counters 62, 60, 82 and 84 will be reset to an initial condition.

Each flip-flop is connected to a respective "Q" output. The "Q" output is further connected to the "D" input of the next succeeding flip-flop, and in this manner, the flip-flops are connected in a ring. Thus, upon clocking of the flip-flops, a "1" bit is advanced from one flip-flop to the next.

When a "1" bit gets to the "Q11" flip-flop of either ring counter 60, the incrementing of the "1" bit stored in ring counter 62 will be enabled through the application of a high transition to the enable input thereof. Ring counter 84 is enabled similarly. Each set of ring counters therefore operates as a two-stage counter for recording an address location inside memory 76.

The ring counters 44 and 46 of depth address generator 30 are in general similar to the ring counters 60 and 62 of the read address generator, except that they may be reset to a position that may be selectively programmed by decoder 30. Instead of a pair of rings of normal flip-flops, ring counters 44 and 46 comprise rings of loadable ring counter units.

Figure 2:
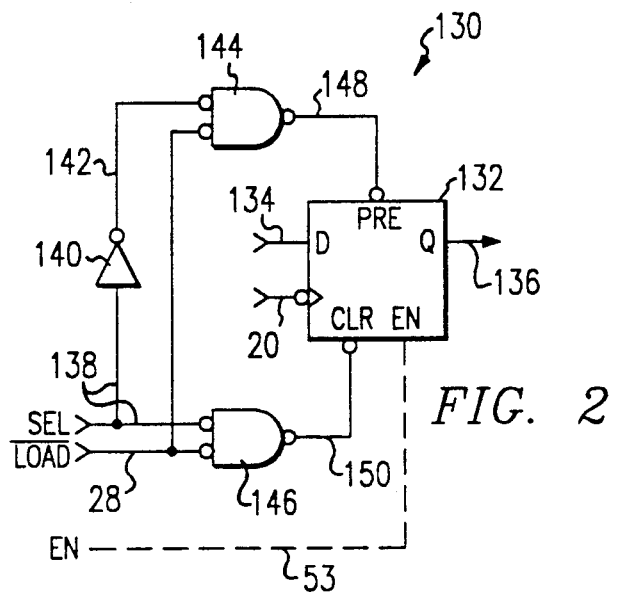
FIG. 2 is a detail of one unit of a programmable depth address generator according to the invention.

Referring now to FIG. 2, a single loadable ring counter unit is indicated generally at 130. Ring counter unit 130 is used to build both low-order ring counter block 46, which contains eleven units 130, and high-order ring counter 44. Ring counter unit 130 includes a D-Q flip-flop 132. An input 134 of flip-flop 132 is connected to the output of a preceding unit (not shown). An output Q of flip-flop 132 is one of the outputs Q1–Q11 of low-order ring counter 46 or is one of the outputs Q1–Q3 of high-order ring counter 44. In addition to being connected to one of the output lines 48 or 54, Q line 136 is connected to the next ring counter unit (not shown). Where unit 130 is the Q11 unit, output line 136 is connected to the clock enable input of high-order ring counter 44.

A select line 138 represents one of the low-order select lines 37 or one of the high-order select lines 35. Select line 138 is connected to an input of an inverter 140. An output 142 of inverter 140 is applied to a first inverting input of a NAND gate 144. Select line 138 is also applied to a first inverting input of a NAND gate 146. Reset line 28 is applied as a $\overline{\text{LOAD}}$ signal to a second input of NAND gate 144 after being inverted, and also to a second input of NAND gate 146 after being inverted.

The output of NAND gate 144 appears on a line 148. The signal appearing on line 148 is inverted and applied to a preset input of flip-flop 132. An output 150 of NAND gate 146 is inverted and is applied to a CLR input of flip-flop 132.

A high bit appearing on select line 138, in combination with a low state on reset or load line 28, causes the loading of a high state into flip-flop 132 through preset line 148. If, however, the load line 28 goes low and the select line is also low, then NAND gate 146 is enabled to issue a low state on line 150, which actuates flip-flop 132 to clear the flip-flop to a low state. In this way, the encoded programmable number appearing on select lines SEL1-SEL11 of the low-order counter 46 and SEL1-SEL3 of the high-order ring counter 44 will be loaded into the flip-flops comprising these ring counters.

Where block 130 is used to construct the high-order depth ring counter 44, clock enable line 53, shown as a dashed line, is connected to a clock enable input of flip-flop 132. A high state on line 53 enables the clocking of flip-flop 132 through clock line 134.

Returning to FIGS. 1a and 1b, read buses 64 and 70 convey the pointed-to read address from read address generator 58 to read process decoder 74. Decoder 74 operates to decode the high-order "1" bit on bus 70 and the low-order "1" bit on bus 64 to select one of the 33 read enable lines 78. The selected read enable line 78 will activate one of the data words within memory 76 for a read operation.

The encoded write address location stored in write address generator 80 is transmitted through write buses 86 and 90 to low-order write latch 88 and high-order write latch 92. When latches 88 and 92 are made transparent by the application of a high state on write pulse line 18, the encoded write address will be transmitted on lines 103 and 107 to write process decoder 106. Decoder 106 operates to decode the high bit appearing on lines 107 and the low-order "1" bit appearing on one of lines 103 to select one of the write enable lines 108. The selected write enable line 108 enables a selected address location inside memory 76 for a write operation.

The invention incorporates a simultaneous memory write feature. Decoder 106 enables a current selected write address location in response to a low-going transition on write pulse line 18, which is converted to a high-going transition by inverter 136. At the same time, write pulse line 18 is clocking counters 82 and 84 to increment the current write address location to the next write address location. The next ascending transition on write pulse line 18 will cause latches 88 and 92 to go transparent and transmit the next address to write process decoder 106, and so on.

Comparator 50 operates to compare the location of a low-order depth bit inside ring counter 46 to a low-order write bit inside of ring counter 82. Similarly, comparator 56 compares the location of a high-order depth bit inside of ring counter 44 with a high-order write bit inside ring counter 84. When the high-order write bit is equal to the high-order depth bit and the low-order write bit is equal to the low-order depth bit, both outputs 94 and 98 of comparator 50 will be low, in turn actuating AND gate 96 to issue a FULL status flag on line 24. This in turn disables read/write controller 12 from generating any further write pulses. Therefore, when the address location indicated by depth address generator 42 equals the write address location indicated by write address generator 80, a FULL status flag will be issued. This is how the depth address generator 42 effectively sets the depth of memory array 76.

Comparators 66 and 72 compare the high- and low-order bits of read address generator 58 and write address generator 80 in a similar manner. When these bits are equal, AND gate 102 is actuated to generate an EMPTY flag on flag line 26. This disables read/write controller 12 from generating further read pulses on line 20.

Figure 4:
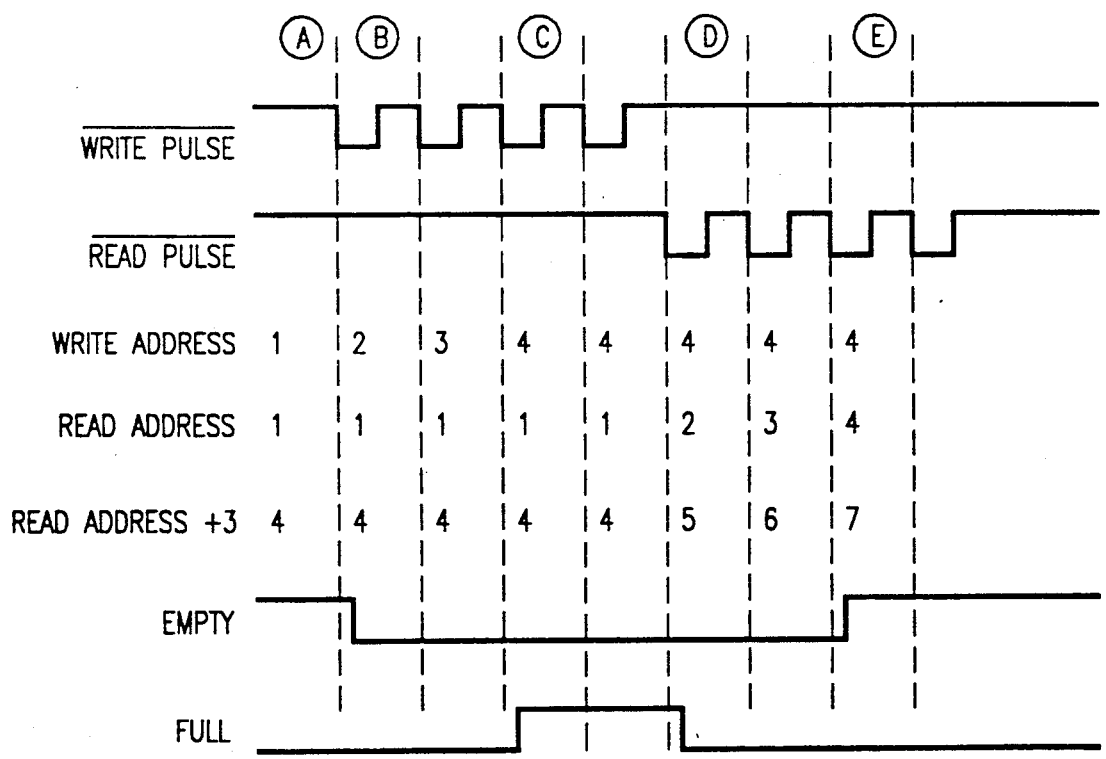
FIG. 4 is a timing diagram showing various signals at points in time in the operation corresponding to FIGS. 3a–3e.

FIGS. 3a-3e are simplified schematic diagrams of memory array states in accordance with the operation of the invention. FIG. 4 is a timing diagram illustrating the states of various signals during points in time corresponding to each of FIGS. 3a-3e.

Referring to FIG. 3a, a condition of the FIFO is illustrated where the depth pointer has been programmed with a number equal to 3, thereby setting the depth pointer three address locations ahead of the read pointer. In FIGS. 3a-3e, the depth pointer is therefore represented as a "read pointer + 3" counter shown at 42. Read pointer 151 corresponds to read address generator 58, and write pointer 152 corresponds to write address generator 80.

In FIG. 3a, the memory array 76 is completely empty, and no valid data are stored therein. Therefore, as shown in region "A" of FIG. 4, the EMPTY status flag is high.

The "B" region of FIG. 4 corresponds to the state of the memory shown in FIG. 3b. At the beginning of this portion of the timing diagram, $\overline{\text{WRITE PULSE}}$ has a low transition. This causes write pointer 152 to increment its "1" bit to word 2 from word 1. The EMPTY flag will go low to indicate that memory array 76 is no longer empty. The read pointer 151 and the depth pointer 42 continue to represent the same word addresses as before. One valid word of data has been written into the memory at this point.

Referring now to the "C" region of FIG. 4, a third write operation is initiated by a descending transition of $\overline{\text{WRITE PULSE}}$. This third write operation is illustrated also by FIG. 3c. The write address is incremented to 4, while the read address continues to point to word 1 and the depth address (equalling the read address plus three) remains pointed to 4. Valid data now exist within words 1 through 3 inside memory 76. In portion "C" of FIG. 4, the write pointer 152 is pointing to the same address as that stored in depth address generator 42. In response to the equality of these conditions, a FULL status flag will be issued, as indicated by the high-going transition of FULL within region "C" of FIG. 4. Because read/write controller 12 is prohibited from generating further write pulses in this condition, the depth of FIFO memory 76 is effectively limited to 3, even though up to 32 words of depth could otherwise be accommodated.

In region "D" of FIG. 4, a first read operation is initiated by a low-going transition of $\overline{\text{READ PULSE}}$. This condition is illustrated by FIG. 3d. The read pointer is incremented by 1 to word 2, and the depth address generator is likewise incremented by 1 to word 5. Hence, the programmed depth stays constant, even as the pointed to read address changes. The FULL flag goes to a low state since the address stored in depth address generator 42 and the address pointed to by write pointer 152 are no longer the same.

In FIG. 3e, a third read operation is illustrated. This is shown by the "E" region of FIG. 4. This third read operation is initiated by a descending transition of $\overline{\text{READ PULSE}}$. The read address will be incremented to word 4, and the depth address will be incremented to word 7. In this condition, the read address and the write address point to the same word in memory 76. Therefore, an EMPTY status flag will be used, as indicated by the high-going transition of EMPTY within region "E" in FIG. 4. As shown in FIG. 3e, FIFO memory 76 is now empty and contains no valid data.

Other embodiments of this invention could include other memory word sizes and different numbers of memory words. The sizes of the ring counters should be chosen such that the product of the number of bits in the high- and low-order ring counters equals a number that is greater than a maximum desired depth of the FIFO by at least one memory word. For example, a 512-word FIFO memory may be fabricated using a 19-stage and a 27-stage ring counter, to give a total of 513 addresses. For smaller FIFOs, single-tier ring counters may replace the dual-tier ring counters shown in the illustrated embodiment, provided its size equals at least one bit more than the maximum FIFO capacity.

In the instance where a single ring counter is used, only one comparator is required for each of read address generator 58 and depth address generator 42, as only two bits are being compared. For larger FIFOs, triple- or even quadruple-tier ring counters may be used. Separate address comparator sections must be used for each tier and their outputs must be combined to decode the FULL and EMPTY conditions.

The present invention can also be used to generate additional status flags. By adding another intermediate depth address generator, another two address compare sections (in the case of two-tier ring counters) and another decoder circuit similar to the program depth decode circuit (FIG. 1a: 30, 34, 39, 41, 36), the extra depth address generator can be used to point to some address between the locations indicated by the read address generators 58 and the depth address generator 42, thus indicating any degree of fullness of the FIFO between FULL and EMPTY as may be desired.

In summary, a first-in, first-out memory having a programmable and reprogrammable depth has been shown and described. The memory can be programmed to any depth up to the maximum capacity of the FIFO memory array to fit a desired application. The FIFO memory of the invention further has a simultaneous memory write/write address increment feature that allows faster write operations.

While a preferred embodiment of the invention has been described in the above detailed description, the invention is not limited thereto, but only by the spirit and scope of the appended claims.

What is claimed is:

1. A first-in, first-out memory for storing a programmable and reprogrammable number of data words therein, comprising:
    a register for storing said number;
    a programmer operable to selectively program and reprogram said number into said register;
    a memory array having a plurality of address locations for storing said data words; and
    a disabler coupled to said register for disabling the storing of data words in said memory array when the number of stored data words is equal to said number.

2. The memory of claim 1, and further comprising a plurality of data inputs for inputting data to a selected word in said memory, said programmer coupled to selected ones of said data inputs for receiving a depth value, said programmer generating said number as a function of said depth value.

3. The memory of claim 2, wherein said number is equal to the data word capacity of said memory minus said depth value.

4. The memory of claim 2, and further comprising a depth program signal source coupled to said programmer, said programmer storing said depth value in response to a first state of said depth program signal, said programmer storing a default depth value in response to a second state of said depth program signal, said default depth value selected such that said number generated in response thereto will be equal to the maximum word capacity of said memory array.

5. A first-in, first-out memory having a plurality of address locations for storing a programmable and reprogrammable number of data words, comprising:
    a read pointer for pointing to a read address in said memory;
    a depth pointer for pointing to a depth address in said memory, said depth address displaced from said read address by said number;
    a programmer coupled to said depth pointer for selectively programming and reprogramming said number into said depth pointer;
    a write pointer for pointing to a write address in said memory; and
    a write disabler coupled to said write pointer and said depth pointer and operable to disable the writing of data to said memory in response to the write address equalling the depth address.

6. A first-in, first out memory for storing a programmable number of data words at a plurality of address locations in said memory, comprising:
    a read pointer for pointing to a read address location in said memory from which a data word is to be read, said pointer incremented to a next read address location in response to receiving a read signal;
    a depth pointer for pointing to a depth address location in said memory displaced from said read address location by a programmed number of address locations, said depth pointer incremented to a next depth address location responsive to said read signal;
    a write pointer for pointing to a write address location related to the location to which data is to be written, said pointer incremented to a next write address location in response to a write signal;
    a programmer for selectively programming and reprogramming said programmed number into said read depth pointer; and
    a comparator for comparing the values of said write address location and said depth address location and operable to generate a memory capacity status flag responsive to the occurrence of a predetermined relation between said values.

7. The memory of claim 6, wherein said predetermined relation between said write address location and said depth address location constitutes equality.

8. The memory of claim 6, wherein said memory capacity status flag constitutes a FULL status flag for indicating that said memory can accept no further data.

9. The memory of claim 8, and further comprising a write controller coupled to said comparator and said write pointer for generating said write signals responsive to receiving external write signals, said write controller disabled from generating said write signals responsive to receiving a FULL status flag.

10. The memory of claim 6, wherein said comparator is further operable to compare the values of said write address location and said read address location, said comparator generating a second memory capacity status flag in response to the occurrence of a predetermined relation between said write address location and said read address location.

11. The memory of claim 10, wherein said predetermined relation between said write address location and said read address location constitutes equality.

12. The memory of claim 10, wherein said second memory status flag is an EMPTY status flag for indicating that said memory has no valid data stored therein.

13. The memory of claim 12, and further comprising a read controller coupled to said comparator, said read pointer and said depth pointer for generating said read signals responsive to external read signals; said read controller disabled from generating read signals in response to receiving said EMPTY status flag.

14. The memory of claim 6, and further comprising:
   an intermediate depth pointer for pointing to an intermediate depth address location in said memory displaced from said read address location by a second programmed number of address locations, said intermediate depth pointer incremented to a next intermediate depth address location responsive to said read signal;
   a second programmer for selectively programming and reprogramming said second programmed number; and
   a second comparator for comparing the value of said write address location and said intermediate depth address location and operable to generate a memory capacity status flag responsive to the occurrence of a predetermined relation between said write address location and said intermediate depth address location.

15. A memory array having a plurality of addressable locations, comprising:
   a read address generator for pointing to a read address location from which a data word is to be read, said read address generator incrementing from a current read address location to a next read address location in response to a read signal;
   a write address generator for pointing to a write address location related to the location to which a data word is to be written, said write address generator incrementing from a current write address location to a next write address location in response to a write signal;
   a depth address generator for pointing to a depth address location in said array displaced from said read address location by a programmed number, said depth address generator incrementing from a current depth address location to a next depth address location in response to said read signal;
   a programmer for programming said depth generator such that the depth address will be a programmed number of addresses away from the read address;
   a first comparator for comparing said read address to said write address and operable to generate an empty signal in response to said read address and said write address being equal;
   a second comparator for comparing said depth address to said write address and operable to generate a full signal in response to said depth address and said write address being equal; and
   a controller for generating said read and write signals in response to external read and write signals, said controller disabled from generating read signals in response to receiving an empty signal and disabled from generating write signals in response to receiving a full signal.

16. The memory of claim 15, wherein said read address generator comprises a high-order read ring counter for storing a high-order read bit and a low-order read ring counter for storing a low-order read bit;
   said depth address generator having a high-order depth ring counter for storing a high-order depth bit and a low-order depth ring counter for storing a low-order depth bit;
   said write address generator having a high-order write ring counter for storing a high-order write bit and a low-order write ring counter for storing a low-order write bit;
   said first comparator comparing the location of said high-order read bit in said high-order read ring counter to the location of said high-order write bit in said high-order write ring counter, and comparing the location of said low-order read bit in said low-order read ring counter to the location of said low-order write bit in said low-order write ring counter, said first comparator issuing an empty signal in response to the respective equality of said high-order read and write bits and said low-order read and write bits; and
   said second comparator comparing the location of said high-order depth bit in said high-order depth ring counter to the location of said high-order write bit in said high-order write ring counter, and comparing the location of said low-order depth bit in said low-order depth ring counter to the location of said low-order write bit in said low-order write ring counter, said second comparator issuing a full signal in response to the respective equality of the high-order depth and write bits and the low-order depth and write bits.

17. The first-in, first-out memory of claim 16, wherein said programmer is operable to generate a high-order bit and a low-order bit for transmission to said high- and low-order ring counters of said depth address generator.

18. The memory of claim 15, and further comprising a write address latch for storing a write address, a write enable output from said write address latch coupled to said memory array for enabling an address location to receive data;
   said write latch enabling a current write address location in said memory array to receive data, and said write address generator incrementing to a next write address location in response to the same write command.

19. A method for programming the depth of a first-in, first-out memory having a plurality of address locations, comprising the steps of:
   incrementing a read pointer from a current read address location in the memory to a next read address location in response to a read signal;
   programming a depth pointer to establish a depth address that is displaced from the read address by a programmed number of address locations;
   incrementing the depth pointer from a current depth address location in the memory to a next depth address location in the memory in response to the read signal;
   incrementing a write pointer from a current write address to a next write address in response to a write signal, the write address related to the write address location in the memory into which a data word is to be written; and disabling the writing of data to the memory in response to the write address equalling the depth address.

20. The method of claim 19, and further comprising the step of disabling the reading of data from the memory in response to the write pointer pointing to the same address location as the read pointer.

21. The method of claim 19, and further comprising the step of reprogramming the depth pointer such that the displacement between the read address and the depth address is equal to a new programmed number.

22. The method of claim 19, wherein said step of programming the depth pointer comprises the further steps of:

generating the programmed number as a function of a read depth value appearing on a plurality of data inputs to the memory.

23. The method of claim 22, wherein said step of programming comprises the further step of:
storing a programmed depth number in a depth address generator, the programmed depth member being equal to the maximum capacity of the memory minus the read depth value.

24. The method of claim 22, and further comprising the steps of:
programming said programmed number into the depth address generator in response to receiving a first state of a depth program signal; and
programming a default number into the depth address generator equal to the maximum capacity of the memory in response to receiving a second state of the depth program signal.

* * * * *